US011255954B2

(12) United States Patent
Fujiwara et al.

(10) Patent No.: US 11,255,954 B2
(45) Date of Patent: Feb. 22, 2022

(54) PHOTO DETECTION ELEMENT, PHOTO DETECTION SYSTEM, LIDAR DEVICE AND VEHICLE COMPRISING A FIFTH REGION OF FIRST CONDUCTIVITY TYPE BETWEEN A FIRST REGION AND A FOURTH REGION

(71) Applicant: Kabushiki Kaisha Toshiba, Minato-ku (JP)

(72) Inventors: Ikuo Fujiwara, Yokohama (JP); Yuki Nobusa, Yokohama (JP); Honam Kwon, Kawasaki (JP); Keita Sasaki, Yokohama (JP); Kazuhiro Suzuki, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 525 days.

(21) Appl. No.: 16/295,525

(22) Filed: Mar. 7, 2019

(65) Prior Publication Data

US 2020/0088852 A1    Mar. 19, 2020

(30) Foreign Application Priority Data

Sep. 13, 2018 (JP) .............................. JP2018-171670

(51) Int. Cl.
| | | |
|---|---|---|
| *G01S 17/89* | (2020.01) | |
| *G01S 7/4865* | (2020.01) | |
| *H01L 27/146* | (2006.01) | |
| *H01L 31/02* | (2006.01) | |
| *H01L 31/107* | (2006.01) | |

(52) U.S. Cl.
CPC ............ *G01S 7/4865* (2013.01); *G01S 17/89* (2013.01); *H01L 27/14643* (2013.01); *H01L 31/02027* (2013.01); *H01L 31/107* (2013.01)

(58) Field of Classification Search
CPC ............ H01L 27/14643; H01L 31/107; H01L 27/1461; H01L 27/1463; H01L 27/02027; G01S 17/89; G01S 7/4865; G01S 17/894
USPC .................................. 250/214 R, 208.1, 239
See application file for complete search history.

(56) References Cited

U.S. PATENT DOCUMENTS

| 9,006,853 B2 | 4/2015 | Ito et al. |
| 10,141,299 B2* | 11/2018 | Toyoda ............... H01L 29/4236 |
| 2011/0272561 A1 | 11/2011 | Sanfilippo et al. |

FOREIGN PATENT DOCUMENTS

| JP | 60-57685 | 4/1985 |
| JP | 62-22546 | 5/1987 |
| JP | 4-279879 | 10/1992 |
| JP | 6-224463 | 8/1994 |
| JP | 2004-319576 A | 11/2004 |
| JP | 2009-105489 | 5/2009 |

(Continued)

*Primary Examiner* — Que Tan Le
(74) *Attorney, Agent, or Firm* — Oblon, McClelland, Maier & Neustadt, L.L.P.

(57) ABSTRACT

In one embodiment, a photo detection element includes a first region of a first conductivity type, a second region of a second conductivity type, a third region of the first conductivity type provided between the first region and the second region, a fourth region of the second conductivity type provided so as to surround a periphery of the second region, in a direction crossing with a direction from the first region toward the second region, and a fifth region of the first conductivity type provided between the first region and the fourth region.

16 Claims, 21 Drawing Sheets

(56) References Cited

FOREIGN PATENT DOCUMENTS

| JP | 2011-204879 | 10/2011 |
|----|-------------|---------|
| JP | 2013-16638 | 1/2013 |
| JP | 2014-59301 A | 4/2014 |
| JP | 2015-41746 A | 3/2015 |
| JP | 2017-32359 A | 2/2017 |
| JP | 2017-219443 | 12/2017 |

* cited by examiner

US 11,255,954 B2

PHOTO DETECTION ELEMENT, PHOTO DETECTION SYSTEM, LIDAR DEVICE AND VEHICLE COMPRISING A FIFTH REGION OF FIRST CONDUCTIVITY TYPE BETWEEN A FIRST REGION AND A FOURTH REGION

CROSS-REFERENCE TO RELATED APPLICATION

This application is based upon and claims the benefit of priority from the prior Japanese Patent Application No. 2018-171670, filed on Sep. 13, 2018, the entire contents of which are incorporated herein by reference.

FIELD

Embodiments described herein relate generally to a photo detection element, a photo detection system, a lidar device and a vehicle.

BACKGROUND

Improvement of photon detective efficiency is desired as a photo detection element.

DETAILED DESCRIPTION

According to one embodiment, a photo detection element includes a first region of a first conductivity type, a second region of a second conductivity type, a third region of the first conductivity type provided between the first region and the second region, a fourth region of the second conductivity type provided so as to surround a periphery of the second region, in a direction crossing with a direction from the first region toward the second region, and a fifth region of the first conductivity type provided between the first region and the fourth region.

Hereinafter, further embodiments will be described with reference to the drawings. Ones with the same symbols show the corresponding ones. In addition, the drawings are schematic or conceptual, and accordingly, the relation between a thickness and a width in each portion, and a ratio of sizes between portions are not necessarily identical to those of the actual ones. In addition, even when the same portions are shown, the dimensions and the ratio thereof may be shown differently depending on the drawings.

First Embodiment

Figure 1A:
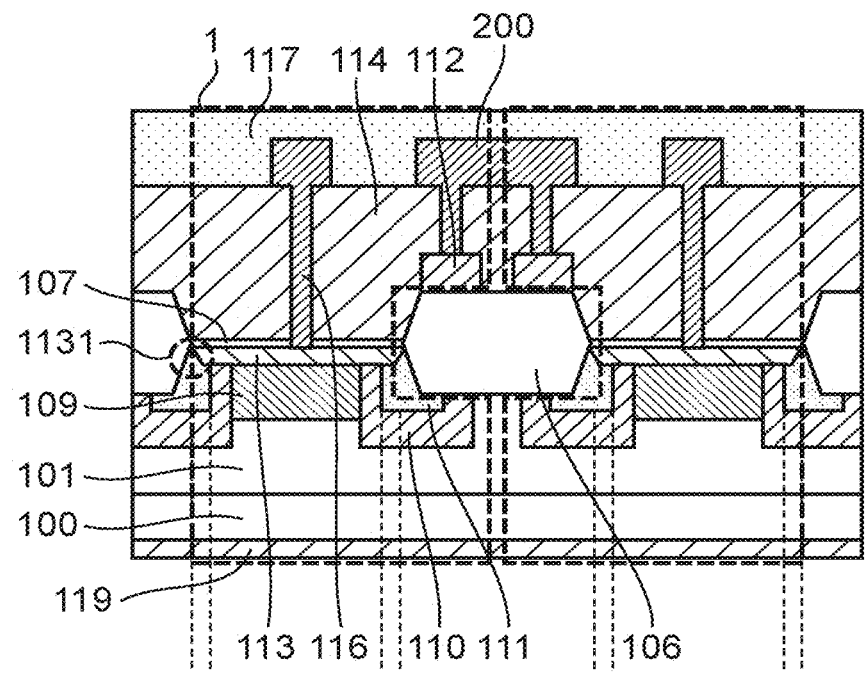
FIGS. 1A, 1B are diagrams showing a photo detector including a photo detection element according to a first embodiment.
Figure 1B:
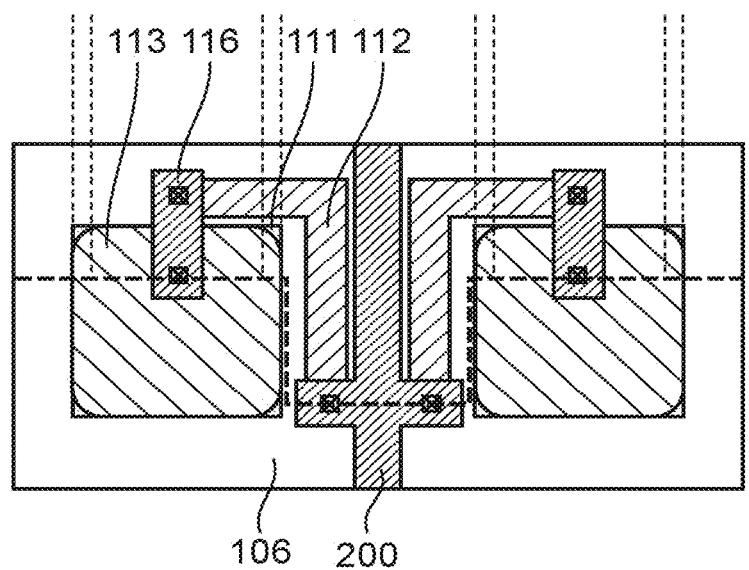

FIGS. 1A, 1B are respectively a sectional view and a top view of a photo detector including a photo detection element 1 according to a first embodiment. FIG. 1A is a sectional view of a dotted line of FIG. 1B.

The photo detector according to the first embodiment, as shown in FIGS. 1A, 1B, includes a plurality of the photo detection elements 1 and an element isolation structure 106 provided among a plurality of the photo detection elements 1.

The photo detection element 1 includes a silicon substrate 101 of a first conductivity type (also called a p-type silicon epitaxial layer, a first region), a second region 113 of a second conductivity type (also called an n-type avalanche layer), a third region 109 of the first conductivity type (also called a p-type avalanche layer) provided between the second region 113 and the silicon substrate 101, a fourth region 111 of the second conductivity type (also called an n-type guard ring layer) provided so as to surround the periphery of the second region 113 in a direction crossing with a direction from the silicon substrate 101 toward the second region 113, and a fifth region 110 of the first conductivity type (also called a p-type guard ring layer) provided between the silicon substrate 101 and the fourth region 111. Further, as shown in FIG. 1A, at least a part of the fifth region 110 is provided between the third region 109 and the fourth region 111.

The photo detection element 1 according to the first embodiment is a pn junction diode in which the third region 109 and the second region 113 are pn joined, and incident light incident from above the second region 113 is subjected to photoelectric conversion in the silicon substrate 101, for example, and the carriers are subjected to avalanche multiplication near the pn junction. At this time, a voltage required for causing avalanche multiplication is called a breakdown voltage. A reverse bias not less than the breakdown voltage is applied to the photo detection element 1, and a quench resistor 112 described later is added. To apply a reverse bias voltage larger than the breakdown voltage is called a Geiger mode operation. A reverse bias not less than the breakdown voltage is applied to the photo detection element 1 to make it perform a Geiger mode operation, and thereby it is possible to obtain luminance information with a wide dynamic range. At this time, a wavelength band of the incident light to the photo detection element 1 is not less than 700 nm and not more than 500 nm, for example.

Further, as shown in FIGS. 1A, 1B, the photo detection element 1 according to the first embodiment includes a back surface electrode 119 provided for applying a reverse bias not less than the breakdown voltage, a single crystal silicon substrate 100 (also called a single crystal p-type silicon substrate) provided between the back surface electrode 119 and the silicon substrate 101, an insulating layer 114 provided for insulating the single crystal silicon substrate 100 and the quench resistor 112 from a first electrode 116, a silicon oxide film 107 provided between the insulating layer 114 and the second region 113 for suppressing a dark current, the first electrode 116 which is electrically connected to the second region 113 and is provided for applying a reverse bias not less than the breakdown voltage to the photo detection element 1 to make it perform a Geiger operation, the quench resistor 112 which is electrically connected to the first electrode 116 and is provided so as to converge the carriers by the voltage drop, a second electrode 200 which is electrically connected to the quench resistor 112 and a reading pad, and a passivation film 117 to protect the first electrode 116 and the second electrode 200.

The single crystal p-type silicon substrate 100 is formed by doping silicon with boron at a concentration of $4E18/cm^3$ ($4.0 \times 10^{18}/cm^3$).

The p-type silicon epitaxial layer 101 is formed by epitaxial growth on the single crystal p-type silicon substrate 100 while being doped with boron at a concentration of $1E15/cm^3$ ($1.0 \times 10^{15}/cm^3$). A thickness of the p-type silicon epitaxial layer 101 is about 10 μm, for example.

The n-type avalanche layer 113 is formed by performing ion implantation of phosphorus into the p-type avalanche layer 109, for example. In addition, at four corners of the pattern of the n-type avalanche layer 113, the breakdown voltage is partially dropped by electric field concentration, and uniform avalanche operation is not obtained, and accordingly, it is preferable to provide a curvature at each of the four corners to perform electric field relaxation. But when the curvature is made larger, an area of the n-type avalanche layer 113 is reduced, and thereby a photon detective efficiency (Photon Detective Efficiency: PDE) of the photo detection element 1 drops. Accordingly, the curvature radius has an optimum range from the viewpoint of electric field relaxation and an opening ratio, and in the present embodiment, the curvature radius is preferably not less than 1 μm and not more than 7 μm.

The p-type avalanche layer 109 is formed by performing ion implantation of boron into the p-type silicon epitaxial layer 101, for example. In addition, it is preferable to provide a curvature at each of four corners of the pattern of the p-type avalanche layer 109 for the same reason as the n-type avalanche layer 113. In the present embodiment, the curvature radius is preferably not less than 1 μm and not more than 7 μm.

The n-type guard ring layer 111 is formed by performing ion implantation of phosphorus so as to surround the periphery of the n-type avalanche layer 113. It is preferable that the n-type guard ring layer 111 covers at least a part of the edge of the isolation structures 106, named Bird's beaks, to reduce the crystal defects caused by stress. By this means, it is possible to suppress after pulse resulting from the defect. The after pulse is a phenomenon in which when a current flows, electrons captured in the defects of the photo detection element 1 are discharged after a definite time, and the electrons cause a secondary current. In addition, it is preferable that the n-type guard ring layer 111 has a lower peak concentration than the n-type avalanche layer 113, covers at least a part of an edge 1131 of the n-type avalanche layer 113, and a depth indicating the concentration peak thereof is deeper than the n-type avalanche layer 113. By this means, it is possible to relax increase of an electric field strength due to electric concentration at the edge 1131 of the end of the n-type avalanche layer 113 by covering the edge 1131 with the n-type guard ring layer 111 having a lower concentration. Regarding the peak concentration and the depth indicating the concentration peak of the embodiment, a section obtained by cutting the photo detector of the embodiment is subjected to secondary ion mass spectrometry (Secondary Ion Mass Spectrometry: SIMS), to create an impurity concentration profile, and a concentration of an apex of the maximum peak in the concentration profile is set to the peak concentration, and a depth at that time is set to the depth indicating the concentration peak. In addition, the pattern of the n-type guard ring layer 111 is to be formed to have a margin added with process alignment precision with the n-type avalanche layer 113, and it is preferable that the pattern of the n-type guard ring layer 111 has the same curvature as the n-type avalanche layer 113.

The p-type guard ring layer 110 is formed by performing ion implantation of boron into the p-type silicon epitaxial layer 101 around the p-type avalanche layer 109, for example. In order to form a potential barrier to the electrons contributing to the avalanche at the p-type layer side, it is preferable that a peak concentration of the p-type guard ring layer 110 is higher than the p-type avalanche layer 109. In addition, the p-type avalanche layer 109 is sufficiently enclosed by the p-type guard ring layer 110, and thereby the above-described effect of electron barrier can be enhanced, and accordingly, it is preferable that a depth indicating the concentration peak of the impurities of the p-type guard ring layer 110 is formed deeper than the p-type avalanche layer 109 in the laminating direction. The laminating direction of the embodiment indicates a direction from the p-type avalanche layer 109 toward the n-type avalanche layer 113. In addition, it is preferable that the p-type guard ring layer 110 connects to the p-type avalanche layer 109, and is formed so as to contain the n-type guard ring layer 111. This is because an electric line of force from the edge 1131 of the n-type avalanche layer 113 is dammed by the p-type guard ring layer 110, and the carriers generated deeply in the p-type silicon epitaxial layer 101 are introduced to the pn junction for performing avalanche multiplication. In addition, the pattern of the p-type guard ring layer 110 is to be formed to have a margin added with process alignment precision with the n-type guard ring layer 111, and it is preferable that the pattern of the p-type guard ring layer 110 has the same curvature as the n-type guard ring layer 111.

Next, a PDE of the photo detection element (the photo detection element 1 according to the first embodiment) having the p-type guard ring layer 110 and the n-type guard ring layer 111 (called a P/N laminated guard ring in combination) and a PDE of a photo detection element without them will be compared.

Figure 2:
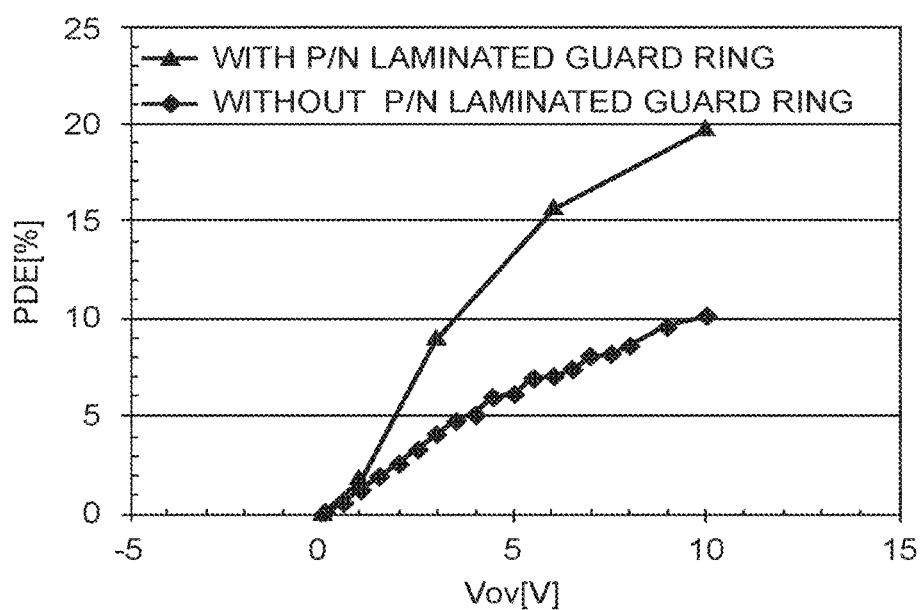
FIG. 2 is a diagram showing dependency of a sensitivity and an over voltage of the photo detection element according to the first embodiment and a general photo detection element.

FIG. 2 is a diagram showing dependency of a PDE and an over voltage Vov with respect to the photo detection element having the P/N laminated guard ring and a photo detection element without the P/N laminated guard ring. Vov=Vop−Vbd. Vop is an operating voltage, and Vbd is a voltage to start avalanche multiplication. For example, when the PDEs thereof are compared when Vov=5 V, PDE=6.1% in the photo detection element without the P/N laminated guard ring, but PDE=14.7% in the photo detection element 1 according to the first embodiment, and accordingly, improvement of the PDE of 8.6% has been obtained.

Figure 3A:
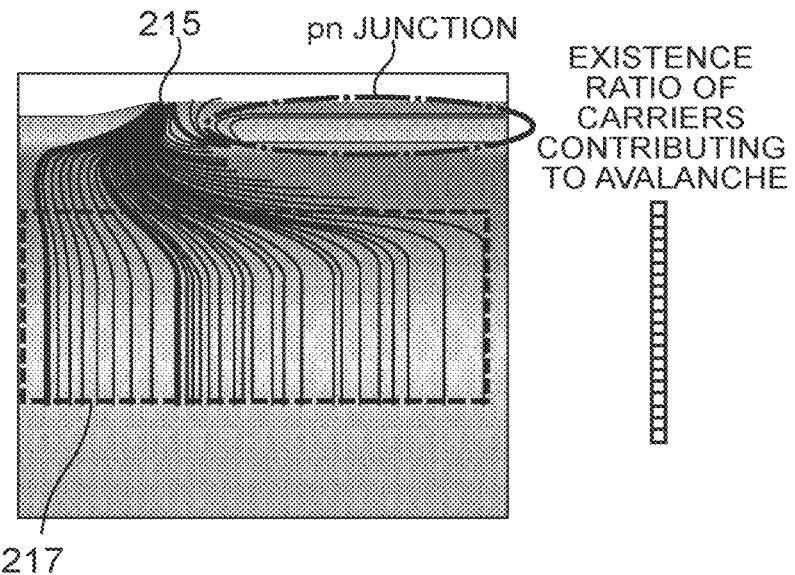
FIGS. 3A, 3B are diagrams respectively showing simulation results of the general photo detection element and the photo detection element according to the first embodiment in which an electric line of force distribution and a distribution of carriers contributing to avalanche multiplication are superimposed.
Figure 3B:
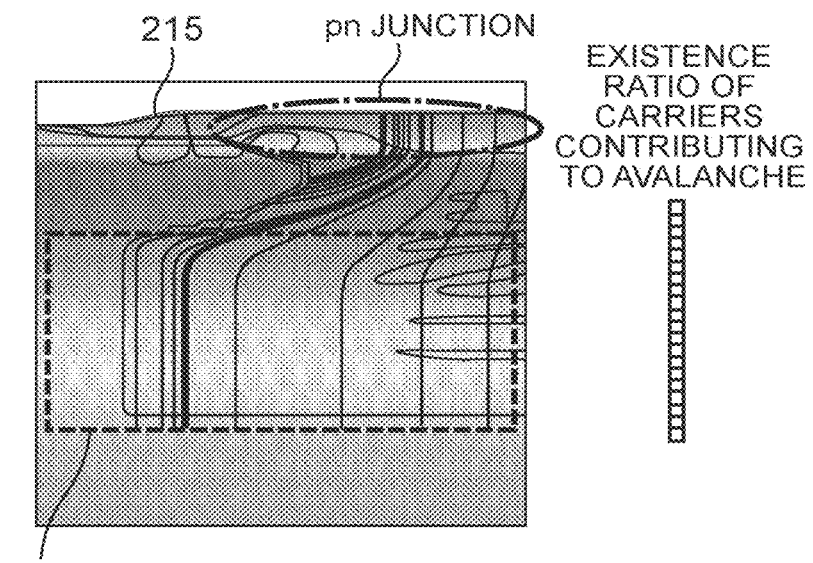

The above-described reason will be described using a result of device simulation. FIGS. 3A, 3B are diagrams respectively showing simulation results in which a distribution of an electric line of force and a distribution of the carriers contributing to the avalanche multiplication when Vov=5V are superimposed, with respect to the photo detection element without the P/N laminated guard ring (FIG. 3A) and the photo detection element with the P/N laminated guard ring (FIG. 3B).

In the photo detection element without the P/N laminated guard ring (FIG. 3A), it is found that carriers existing in a deep region 217 of the p-type silicon epitaxial layer 101 are injected into a curvature portion 215 of the n-type avalanche layer 113 where avalanche multiplication is not generated to form a dead region. In contrast, in the photo detection element with the P/N laminated guard ring (FIG. 3B), carriers existing in the deep region 217 of the p-type silicon epitaxial layer 101 are not injected into the curvature portion 215 of the n-type avalanche layer 113 where avalanche multiplication is not generated. That is, it has been found that since the electric line of force heads for the pn junction by the effect of the P/N laminated guard ring, the carriers in the region 217 contribute to avalanche multiplication, and thereby the PDE is improved.

Figure 4:
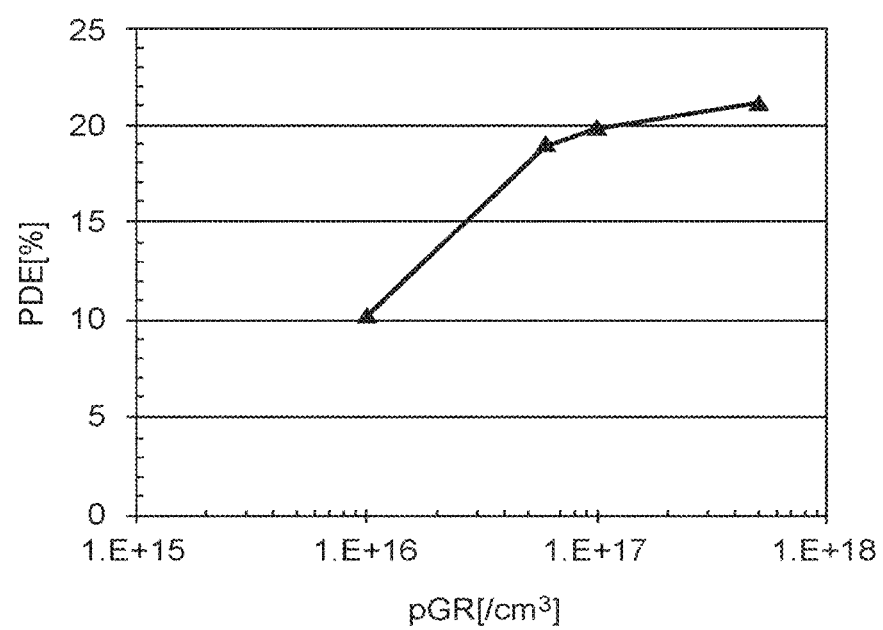
FIG. 4 is a diagram showing variation in sensitivity when photo detection elements according to the first embodiment have been manufactured with the P/N laminated guard ring being different concentrations.

FIG. 4 is a diagram showing change of a PDE when photo detection elements were manufactured wherein a concentration of the p-type avalanche layer 109 is set to 6e16/cm3 ($6.0\times10^{16}$/cm$^3$), and concentrations of the P/N laminated guard rings are set to different concentrations. In addition, the p-type guard ring layer 110 and the n-type guard ring layer 111 have concentrations of the same level. As shown in FIG. 4, it has been found that a PDE increases as a concentration of the P/N laminated guard ring rises, and when the concentration of the p-type avalanche layer 109 and the concentration of the P/N laminated guard ring are at the same level, the PDE becomes inclined to saturation. That is, it is desirable that the concentration of the P/N laminated guard ring is at the same level as or larger than the concentration of the p-type avalanche layer 109, because the PDE is improved. Regarding "the same level" in the embodiment, ±5% is in a range of the same level.

Next, a manufacturing method of the photo detector according to the first embodiment will be described.

Figure 5A:
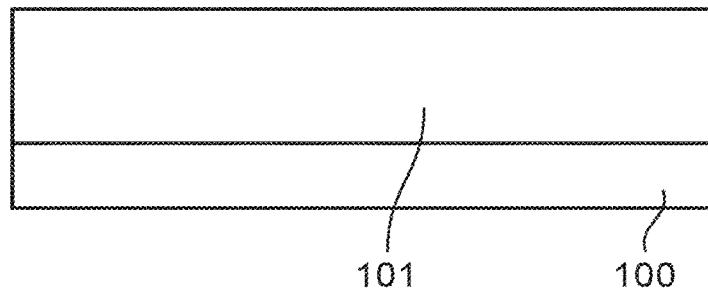
FIGS. 5A, 5B are diagrams showing a manufacturing method of the photo detector including the photo detection element according to the first embodiment.
Figure 5B:
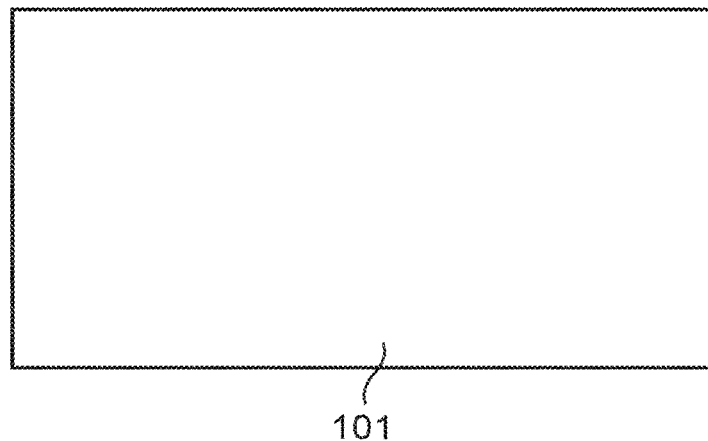

As shown in FIGS. 5A, 5B, for example, a wafer is prepared in which the p-type silicon epitaxial layer 101 doped with boron at a concentration of 1E15/cm3 ($1.0\times10^{15}$/cm$^3$) is epitaxially grown in a thickness of 10 μm on the single crystal p-type silicon substrate 100 doped with boron at a concentration of 4E18/cm3 ($4.0\times10^{18}$/cm$^3$).

Figure 6A:
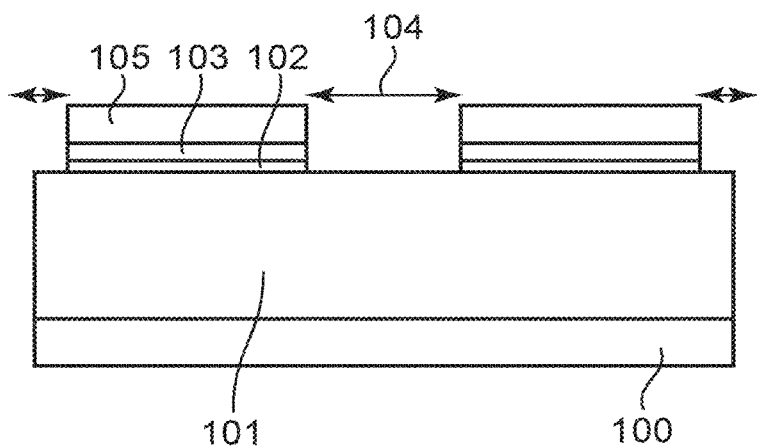
FIGS. 6A, 6B are diagrams showing the manufacturing method of the photo detector including the photo detection element according to the first embodiment.
Figure 6B:
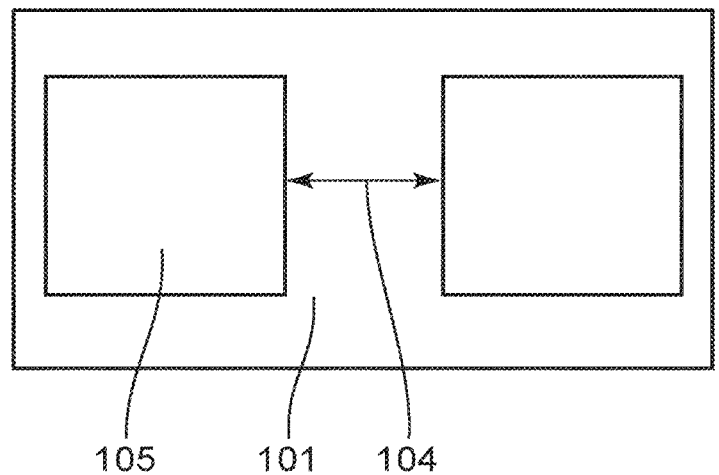

Next, as shown in FIGS. 6A, 6B, for example, a surface of the p-type silicon epitaxial layer 101 is oxidized to form a silicon oxide film 102 of a thickness of 100 nm, and then a silicon nitride film 103 is deposited thereon by a reduced pressure thermal CVD method in a thickness of 150 nm. Then a resist 105 to define an element isolation region 104 is pattern-formed by a lithography process, and the silicon nitride film 103 and the silicon oxide film 102 at a resist opening portion are removed by an RIE (Reactive Ion Etching) method.

Figure 7A:
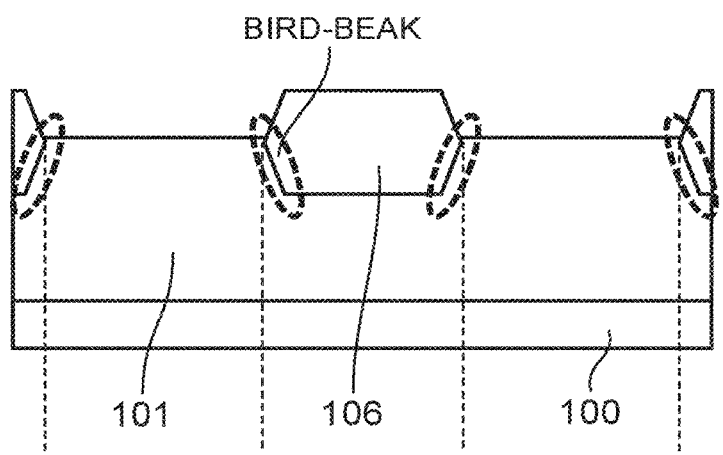
FIGS. 7A, 7B are diagrams showing the manufacturing method of the photo detector including the photo detection element according to the first embodiment.
Figure 7B:
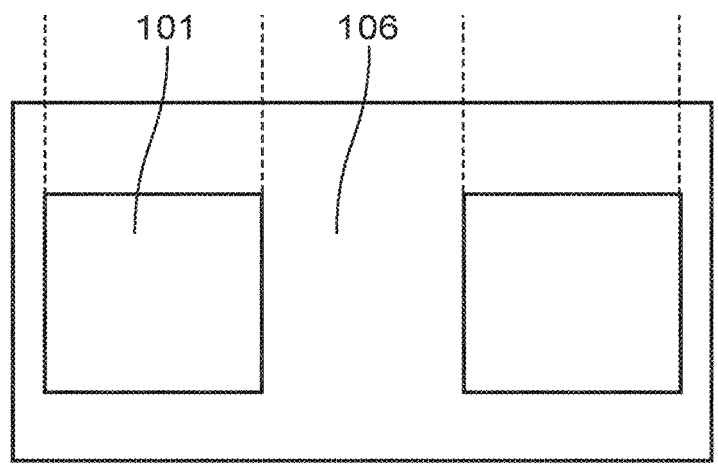

Next, as shown in FIGS. 7A, 7B, for example, the element isolation structure 106 is formed by a LOCOS (Local Oxidation) method on the surface of the p-type silicon epitaxial layer 101 using a normal LSI manufacturing process, and then the silicon nitride film 103 and the silicon oxide film 102 are removed by etching. At this time, an intrusion depth of the element isolation structure 106 into the p-type silicon epitaxial layer 101 side was about 0.4 μm. In addition, a bird-beak is formed on the element isolation structure 106 during the manufacturing process such as an oxidation process, and a stress-type defect is generated therein to induce an after pulse. For the reason, it is necessary to suppress generation of avalanche at the periphery of the bird-beak.

Figure 8A:
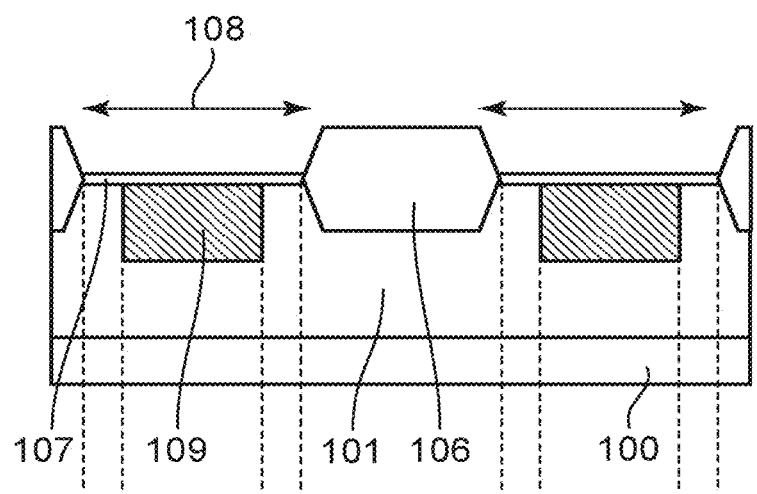
FIGS. 8A, 8B are diagrams showing the manufacturing method of the photo detector including the photo detection element according to the first embodiment.
Figure 8B:
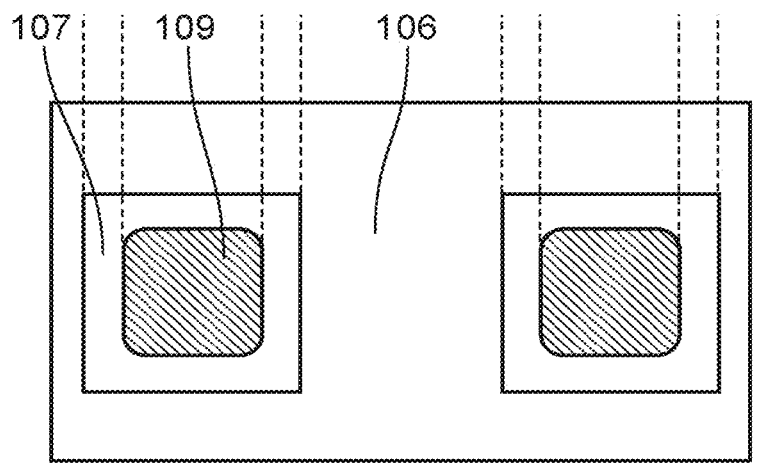

Next, as shown in FIGS. 8A, 8B, the surface of the p-type silicon epitaxial layer 101 is oxidized to form a silicon oxide film 107 of a thickness of 50 nm, and then the p-type avalanche layer 109 is pattern-formed in an element region 108 by a lithography process and an ion implantation process. In the case of providing a curvature, a pattern is formed using a mask with a curvature at the edge at the time of the ion implantation.

Figure 9A:
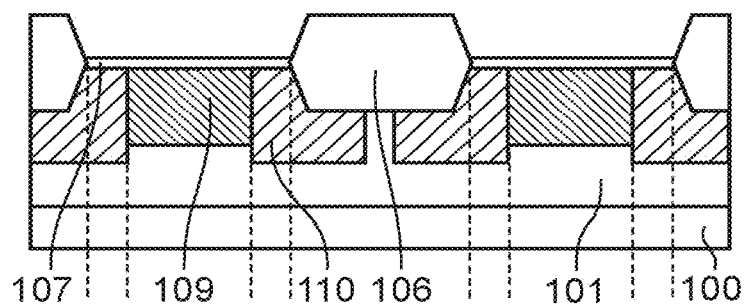
FIGS. 9A to 9D are diagrams showing the manufacturing method of the photo detector including the photo detection element according to the first embodiment.
Figure 9B:
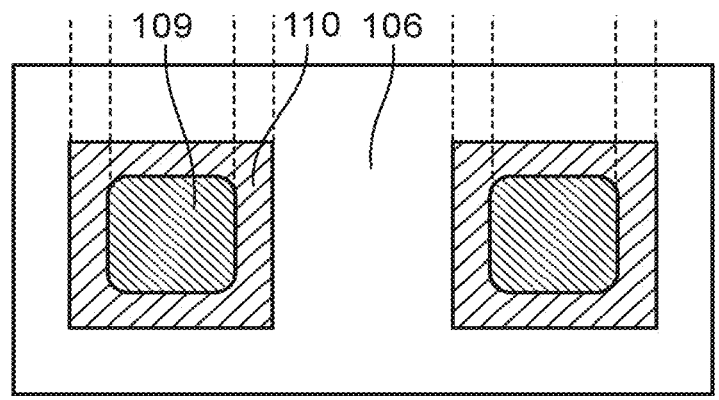
Figure 9C:
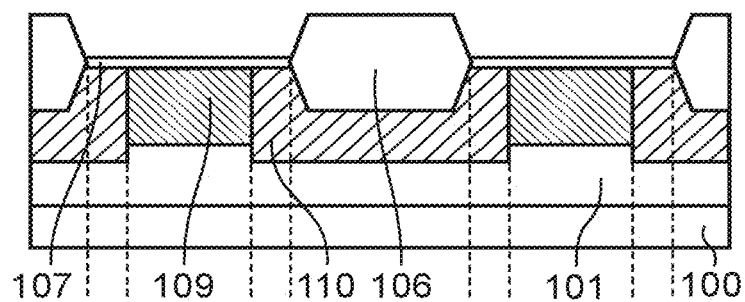
Figure 9D:
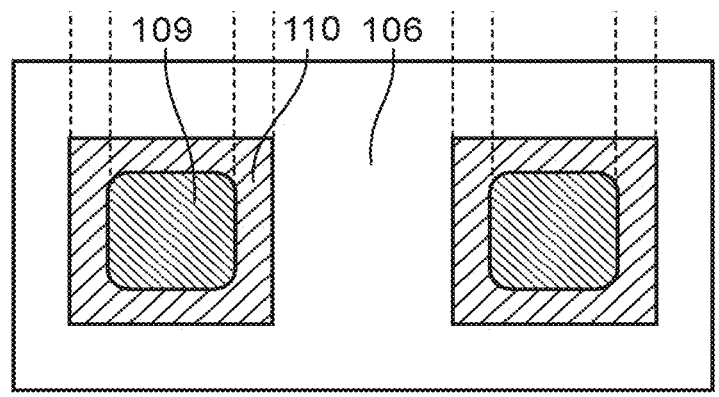

Next, as shown in FIGS. 9A, 9B, the p-type guard ring layer 110 is pattern-formed in the element region 108 by a lithography process and an ion implantation process. For example, the ion implantation is performed using boron as the ion implantation species to obtain that a depth indicating the concentration peak and a peak concentration of the p-type guard ring layer 110 are respectively 1.1 μm and 1E17/cm3 ($1.0\times10^{17}$/cm$^3$). Not based on FIG. 9A, the p-type guard ring layer 110 may not be separated below the element isolation structure 106, but may be provided to cover the element isolation structure 106, as shown in FIGS. 9C, 9D.

Figure 10A:
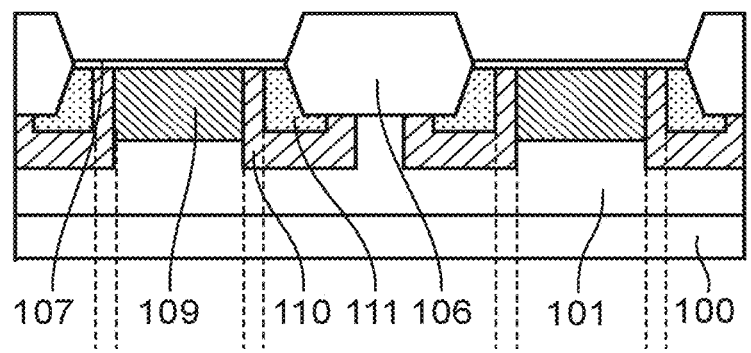
FIGS. 10A, 10B are diagrams showing the manufacturing method of the photo detector including the photo detection element according to the first embodiment.
Figure 10B:
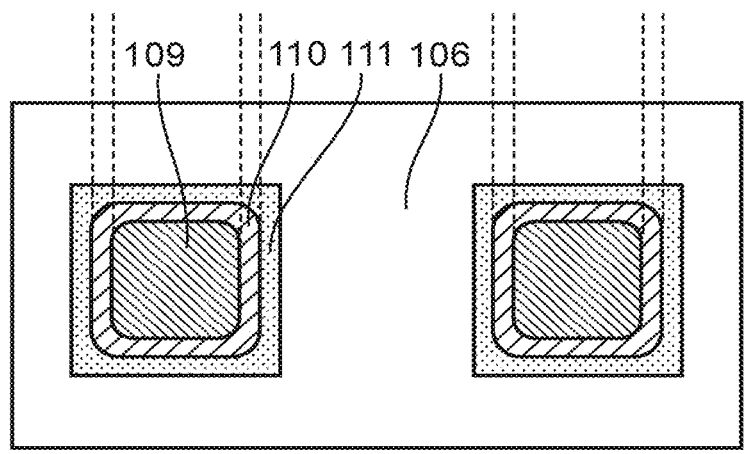

Next, as shown in FIGS. 10A, 10B, the n-type guard ring layer 111 is pattern-formed in the element region 108 by a lithography process and an ion implantation process. For example, the ion implantation is performed using phosphorus as the ion implantation species to obtain that a depth indicating the concentration peak and a peak concentration of the n-type guard ring layer 111 are respectively 0.4 μm and 1E17/cm3 ($1.0\times10^{17}$/cm$^3$).

After this, annealing for activating the p-type avalanche layer 109, the p-type guard ring layer 110, and the n-type guard ring layer 111 is performed.

Figure 11A:
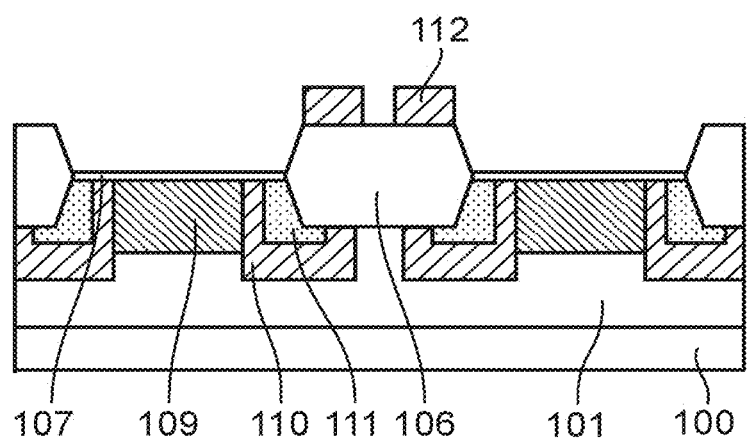
FIGS. 11A, 11B are diagrams showing the manufacturing method of the photo detector including the photo detection element according to the first embodiment.
Figure 11B:
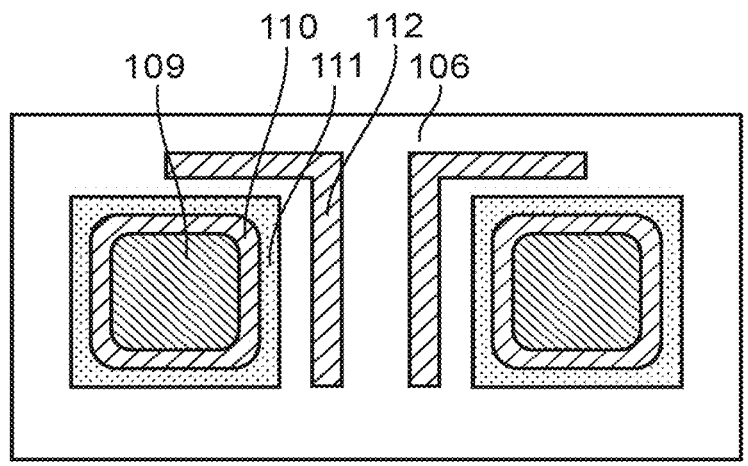

Next, as shown in FIGS. 11A, 11B, for example, a polysilicon film is formed at a thickness of 0.2 μm by a reduced pressure thermal CVD method, and is processed into a prescribed shape by a lithography process and an RIE process to form the quench resistor 112. In order that a prescribed resistance value is obtained, ion implantation of boron is performed into the quench resistor 112 with an ion implantation voltage of 20 keV to obtain an impurity concentration of about 1E15/cm3 ($1.0 \times 10^{15}$/cm$^3$), and then an activation annealing is performed.

Figure 12A:
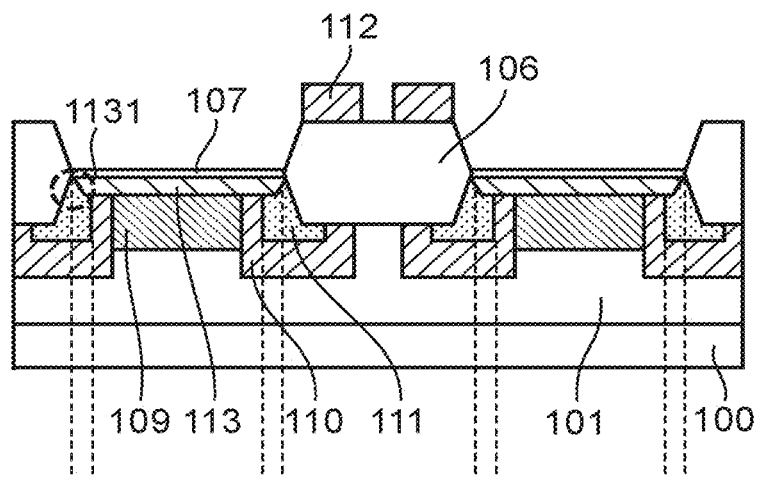
FIGS. 12A, 12B are diagrams showing the manufacturing method of the photo detector including the photo detection element according to the first embodiment.
Figure 12B:
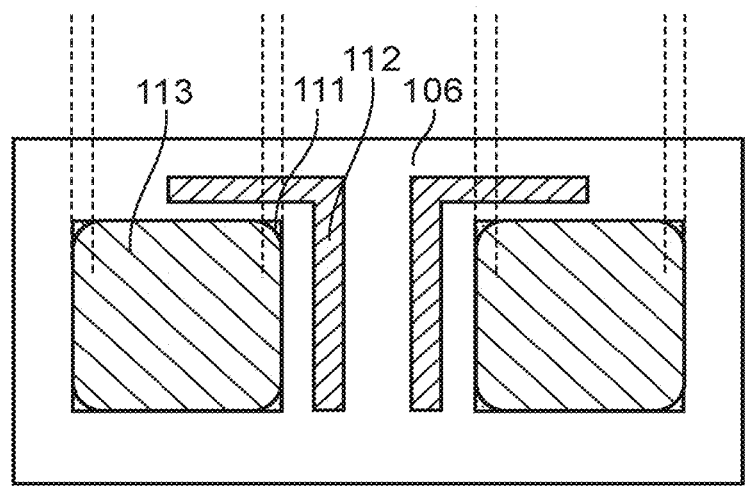

Next, as shown in FIGS. 12A, 12B, the n-type avalanche layer 113 doubling as an ohmic electrode portion of a metal electrode and the silicon layer is pattern-formed in the element region 108 by a lithography process and an ion implantation process. For example, the ion implantation is performed using phosphorus as the ion implantation species to obtain that a depth indicating the concentration peak and a peak concentration of the n-type avalanche layer 113 are respectively 0.2 μm and 1.5e20/cm3 ($1.5 \times 10^{20}$/cm$^3$). After this, a rapid annealing processing for activating the n-type avalanche layer 113 is performed.

Figure 13A:
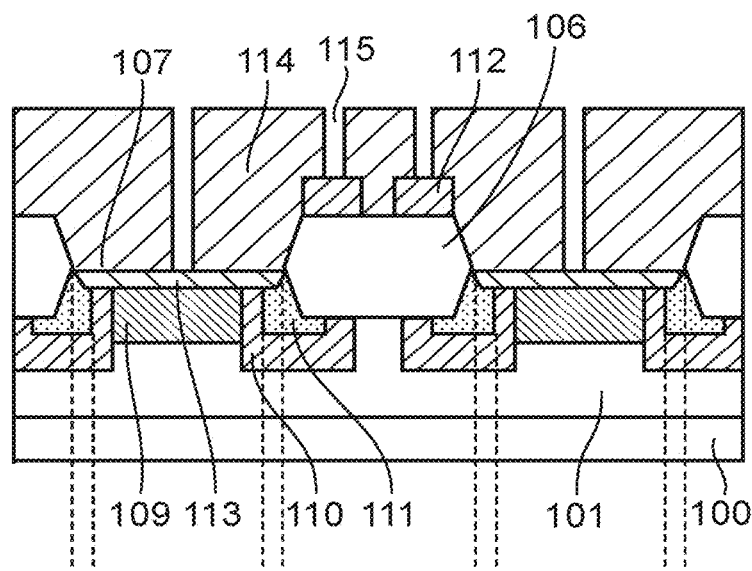
FIGS. 13A, 13B are diagrams showing the manufacturing method of the photo detector including the photo detection element according to the first embodiment.
Figure 13B:
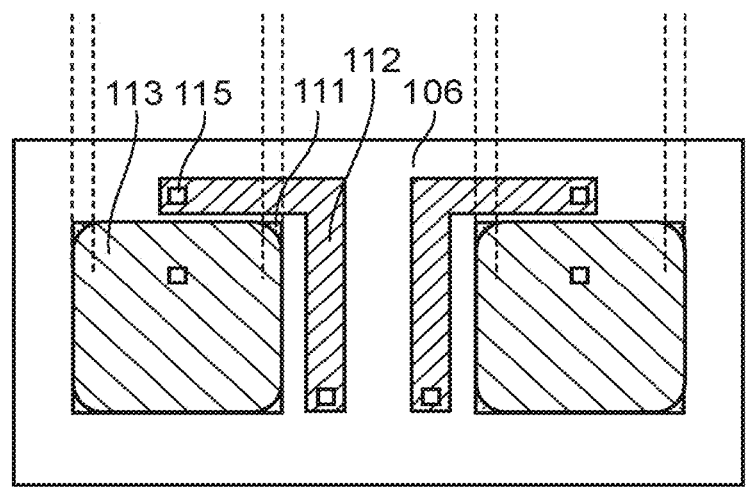

Next, as shown in FIGS. 13A, 13B, the insulating film layer 114 is formed at a thickness of 0.8 μm by a CVD method, and contact holes 115 are formed on the quench resistor 112 and the n-type avalanche layer 113 by a lithography process and an RIE process.

Next, each of the electrodes 116, 200 is formed by a sputtering method at a thickness of 0.8 μm, for example, and is processed into a prescribed shape by a lithography method and an RIE method. At this time, each of the electrodes 116, 200 is also embedded into the contact hole 115 to form a contact with the n-type avalanche layer 113. After that, a silicon nitride film as the passivation film 117 is formed at a thickness of 0.3 μm by a CVD method, and a reading pad is opened by an RIE method. Finally, a Ti/Au film is formed as the mutual back surface electrode 119 on the back surface of the single crystal p-type silicon substrate 100, to manufacture the photo detector shown in FIGS. 1A, 1B.

By this means, in the photo detection element 1, the first electrode 116 side becomes an anode electrode, and the back surface electrode 119 side becomes a cathode electrode. In FIGS. 1A, 1B, the photo detector including the two photo detection elements 2 is shown, but the number of the photo detection elements is not limited to this. In addition, a plurality of the photo detection elements 1 are arranged in an array shape to configure a photo detector.

In order to operate the photo detector actually, a negative operating voltage (Vop), that is a bias voltage in the range of not less than −29V and not more than −20V for example, is applied to the back surface electrode 119 side, and the reading pad is used as the GND potential.

Generally, in order to enhance sensitivity of the photo detection element, it is required that the photo detection element is stably operated to increase uniformity of Vbd. Vdb depends on an integrated value of the electric field strength which the carriers drifting in the depletion layer by the pn junction receive. The electric field strength depends on a three dimensional concentration distribution of a diffusion layer, and particularly the electric field strength due to perform electric field relaxation increases in a region where the depth direction distribution of the high concentration diffusion layer has a curvature. By this means, the uniformity of Vbd drops. In view of the above, the photo detection element according to the present embodiment relaxes increase of the electric field strength due to the electric field concentration at the edge curvature portion of the n-type avalanche layer by being covered with the n-type guard ring layer 111 having a low concentration, and thereby the uniformity of Vbd is improved, and a path of the photoelectric conversion carriers is separated from the vicinity of the side surface damage layer at the time of forming the element isolation structure 106, and thereby it is possible to suppress the after pulse noise resulting from a defect. As a result, the photo detection element according to the present embodiment improves PDE.

Second Embodiment

Points different from the first embodiment will be described.

Figure 14A:
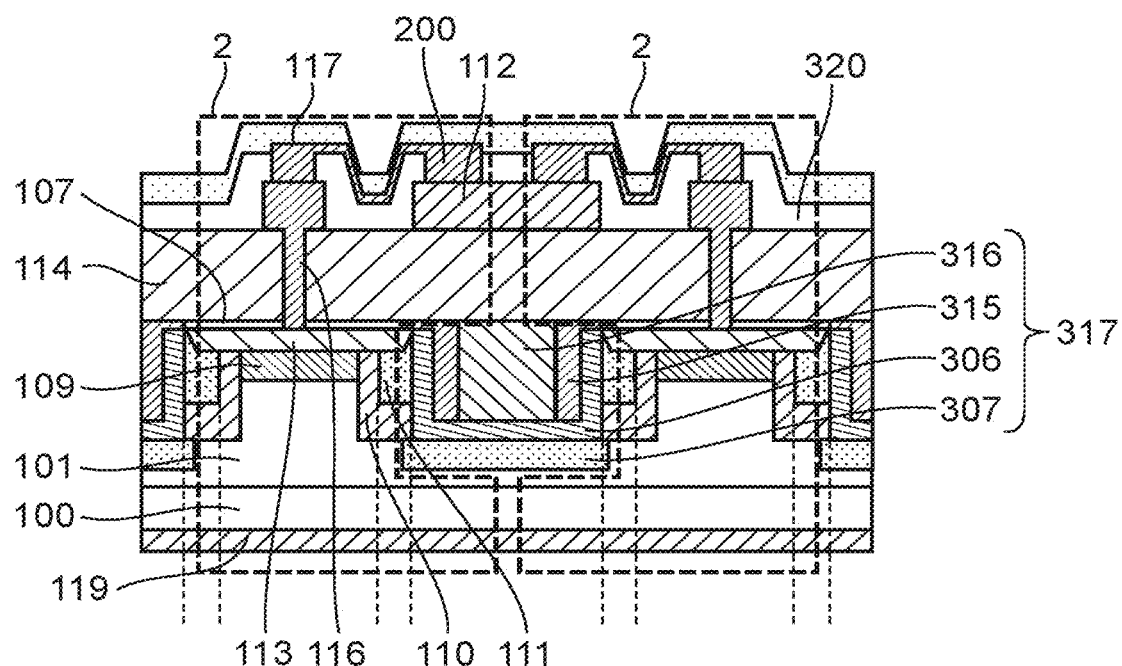
FIGS. 14A, 14B are diagrams showing a photo detector according to a second embodiment.
Figure 14B:
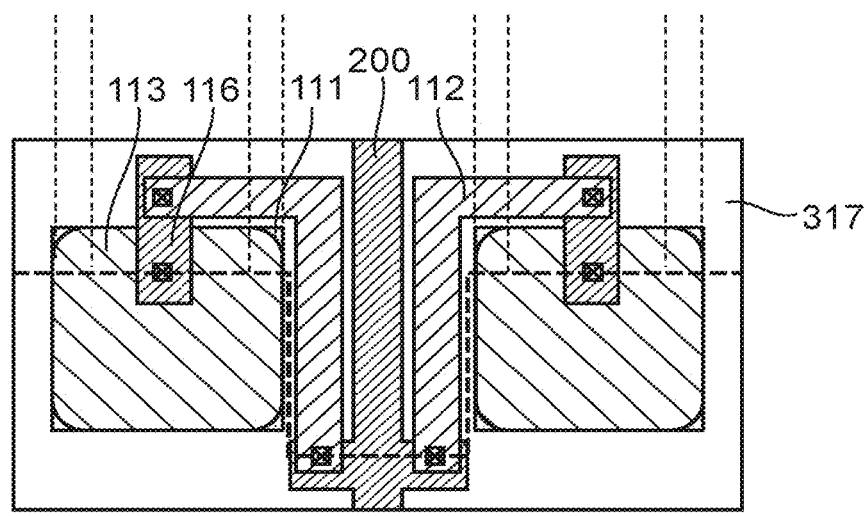

FIGS. 14A, 14B are respectively a sectional view and a top view of a photo detector including a photo detection element 2 according to a second embodiment. FIG. 14A is a sectional view of a dotted line of FIG. 14B.

As shown in FIGS. 14A, 14b, the photo detector according to the second embodiment includes a plurality of the photo detection elements 2 according to the first embodiment, and a trench-type element isolation structure 317 provided among a plurality of the photo detection elements 2.

The photo detection element 2 according to the second embodiment is further provided with an insulating layer 320 provided so as to cover the insulating layer 114 and the electrodes 116, 200. In addition, the quench resistor 112 is provided between the insulating layer 320 and the passivation film 117.

The trench-type element isolation structure 317 includes a p-type implantation layer 307, a thermal oxidation layer 306 provided so as to cover side surfaces of the p-type guard ring layer 110 and the n-type guard ring layer 111 and a surface of the p-type implantation layer 307, a barrier metal 315 provided so as to cover a side surface of the thermal oxide film 306, and an embedded metal 316 made of tungsten which is provided so as to cover a side surface of the barrier metal 315 and the thermal oxide film 306.

The thermal oxide film 306 is provided for improvement of etching damage of the side surface and the back surface of the element isolation structure 317, improvement of film forming property of the barrier metal 315, and a diffusion barrier of titanium composing the barrier metal 315 into Si.

The p-type implantation layer 307 is provided for suppressing defects due to the RIE damage. The p-type implantation layer 307 is formed by performing ion implantation of boron into the p-type silicon epitaxial layer 101 at a vertical angle.

The embedded metal 316 is provided for reflecting or absorbing secondary photons generated when avalanche multiplication is generated in the neighboring photo detection element and thereby for suppressing optical cross talk.

The barrier metal 315 is provided for prohibit of tungsten composing the embedded metal 316 into Si, and improvement of adhesiveness to the thermal oxide film 306.

Next, a manufacturing method of the photo detection element 2 according to the second embodiment will be described.

Figure 15A:
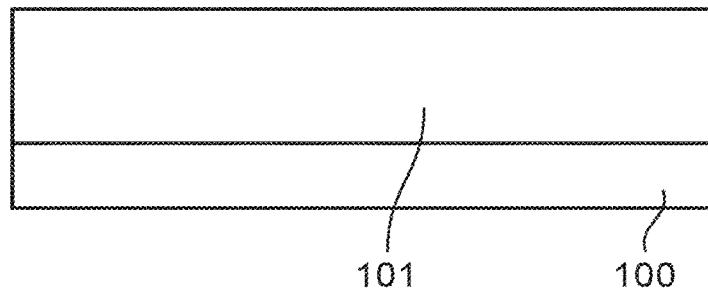
FIGS. 15A, 15B are diagrams showing a manufacturing method of the photo detector including the photo detection element according to the second embodiment.
Figure 15B:
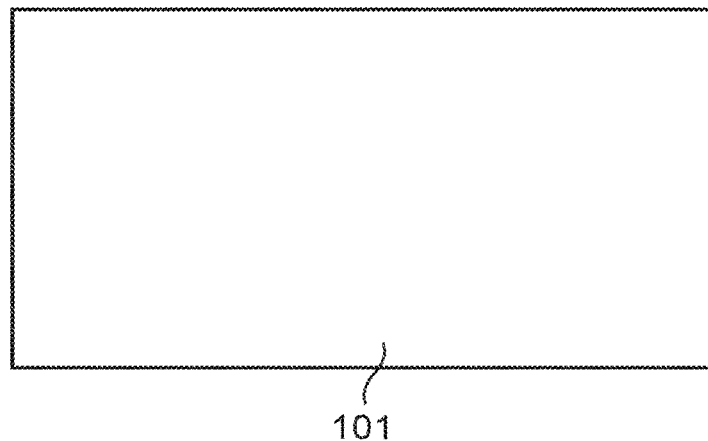

In the photo detection element 2 according to the second embodiment, as shown in FIGS. 15A, 15B, a wafer is prepared in which a p-type silicon epitaxial layer 101 doped with boron at a concentration of 1E15/cm3 ($1.0 \times 10^{15}$/cm$^3$) is epitaxially grown in a thickness of 10 μm, on a single crystal p-type silicon substrate 100 doped with boron at a concentration of 4E18/cm3 (4.0×10$^{18}$/cm$^3$).

Figure 16A:
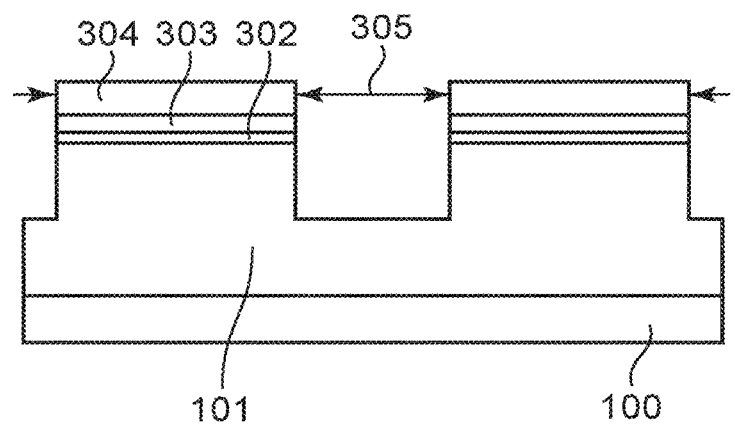
FIGS. 16A, 16B are diagrams showing the manufacturing method of the photo detector including the photo detection element according to the second embodiment.
Figure 16B:
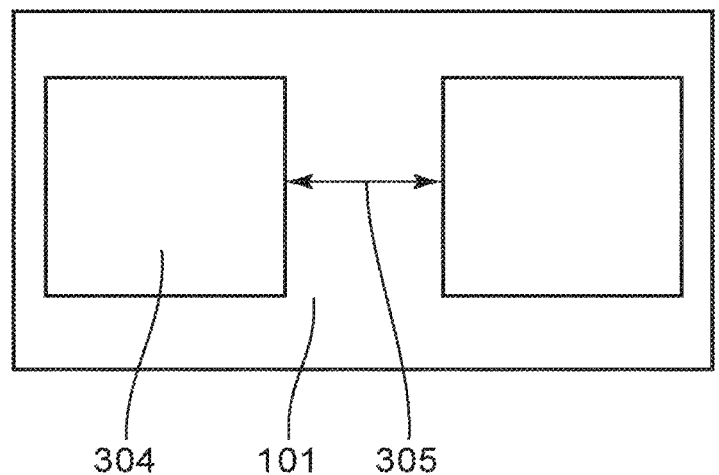

Next, as shown in FIGS. 16A, 16B, a surface of the p-type silicon epitaxial layer 101 is oxidized to form a silicon oxide film 302 of a thickness of 10 nm, and then a silicon nitride film 303 and a silicon oxide film 304 are deposited thereon by a reduced pressure thermal CVD method in thicknesses of 150 nm and 150 nm, respectively, for example. Then a resist to define an element isolation region 305 of a width of 1 μm is pattern-formed by a lithography process, and the silicon oxide film 304, the silicon nitride film 303 and the silicon oxide film 302 at a resist opening portion are removed by an RIE method. After this, the p-type silicon epitaxial layer 101 is etched by 8 μm by an RIE method using the silicon oxide film 304, the silicon nitride film 303, and the silicon oxide film 302 as a mask, to form a trench groove in the element isolation region 305.

Figure 17A:
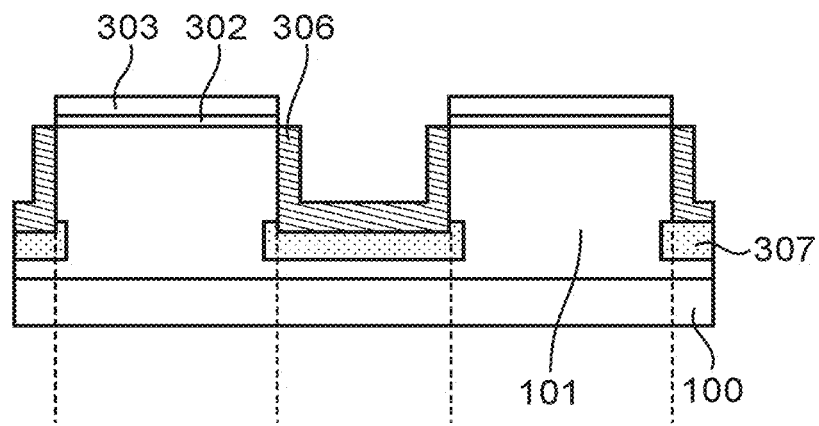
FIGS. 17A, 17B are diagrams showing the manufacturing method of the photo detector including the photo detection element according to the second embodiment.
Figure 17B:
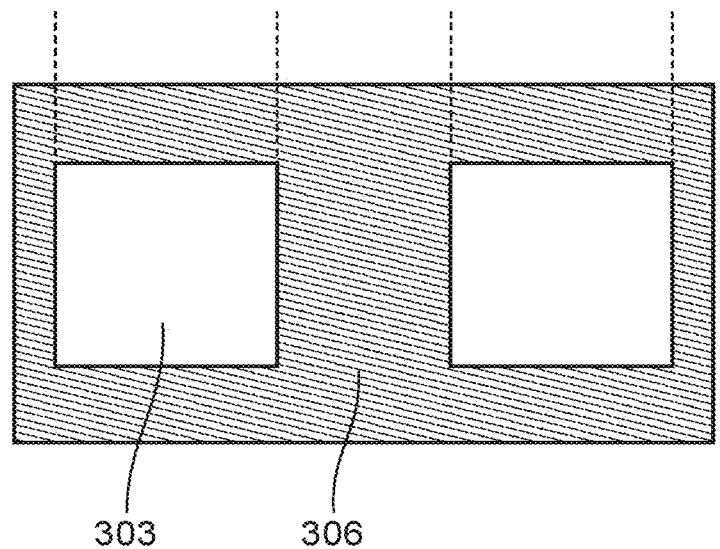

Next, as shown in FIGS. 17A, 17B, the silicon oxide film 304 is removed by a hydrofluoric acid solution, and the thermal oxide film 306 with a thickness of 50 nm is formed on a surface of silicon by thermal oxidation. Then the p-type implantation layer 307 is formed in the vicinity of the trench groove bottom portion by performing ion implantation of boron into the p-type silicon epitaxial layer 101 at a vertical angle, and is activated by an annealing processing at 1000° C. for 30 minutes. The p-type implantation layer 307 may be omitted.

Figure 18A:
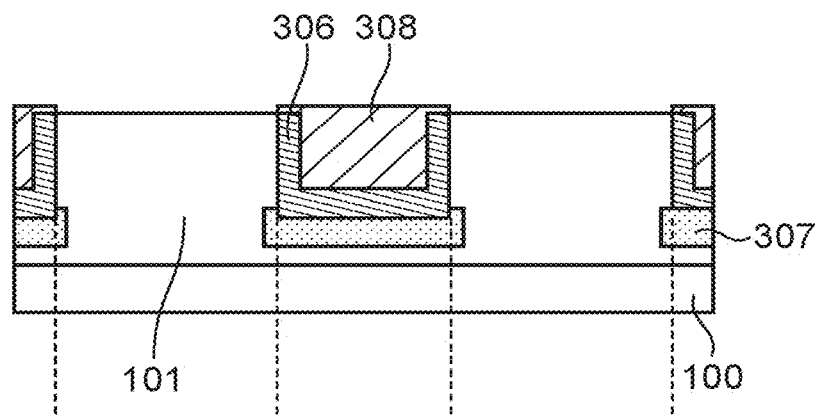
FIGS. 18A, 18B are diagrams showing the manufacturing method of the photo detector including the photo detection element according to the second embodiment.
Figure 18B:
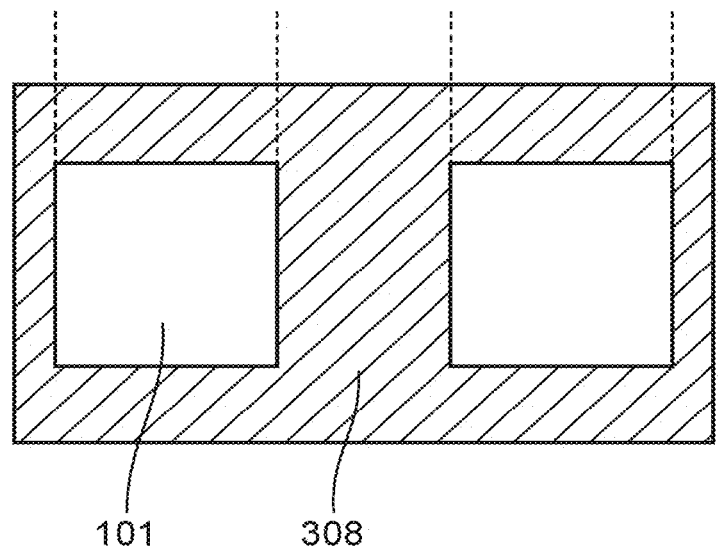

Next, as shown in FIGS. 18A, 18B, for example, an embedded silicon oxide film 308 is deposited by a CVD method by 0.6 μm, and is planarized by an insulating film CMP method. By this means, the trench-type element isolation region 317 is formed. After this, the silicon nitride film 303 and the silicon oxide film 302 are removed by a thermal phosphoric acid processing and a hydrofluoric acid processing, respectively.

The silicon oxide film 107, the p-type avalanche layer 109, the p-type guard ring layer 110, the n-type guard ring layer 111, and the n-type avalanche layer 113 doubling as the ohmic electrode portion of the metal electrode and the silicon layer are respectively formed in an element region 108 by the same lithography processes and the same ion implantation processes as in the first embodiment.

Figure 19A:
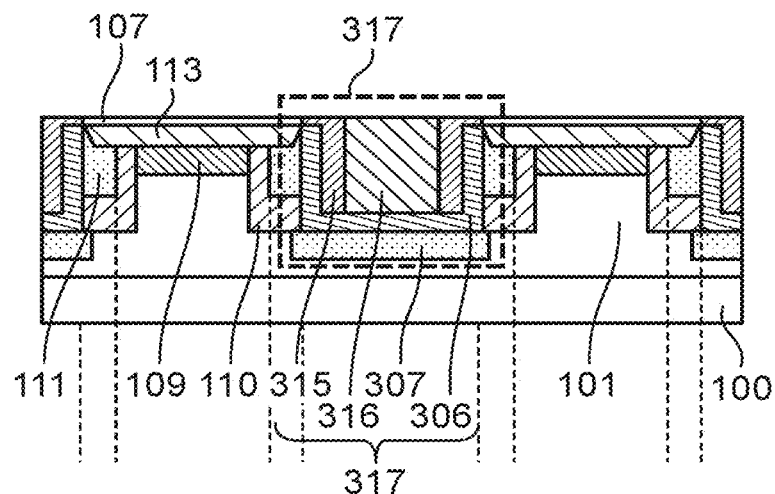
FIGS. 19A, 19B are diagrams showing the manufacturing method of the photo detector including the photo detection element according to the second embodiment.
Figure 19B:
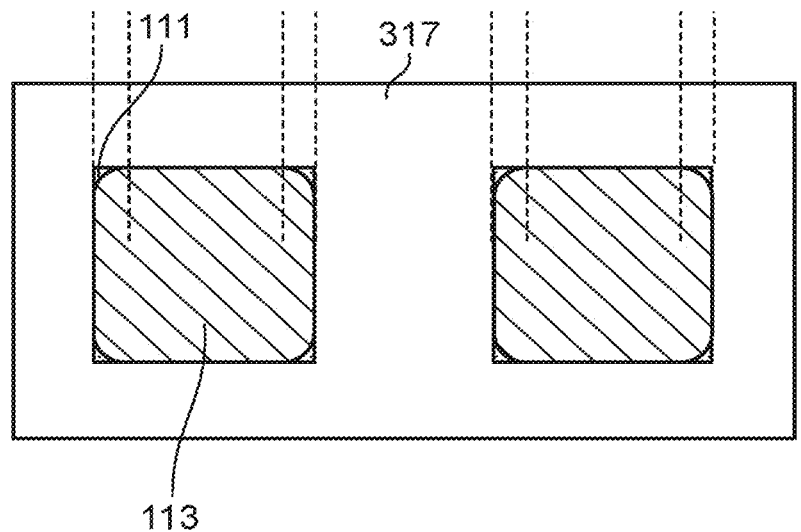

Next, as shown in FIGS. 19A, 19B, a resist pattern of a shape surrounding the element region 108 with a width of 0.8 μm is formed in the element isolation region 305 by a lithography process, and the embedded silicon oxide film 308 is removed by etching by an RIE method. After that, titanium and titanium nitride as the barrier metal 315 are deposited in thicknesses of nm and 10 nm by sputtering methods, respectively. Next, tungsten is deposited in a thickness of 0.22 μm by a CVD method, and is planarized by a CMP method. By this means, the trench-type element isolation structure 317 is formed.

Figure 20A:
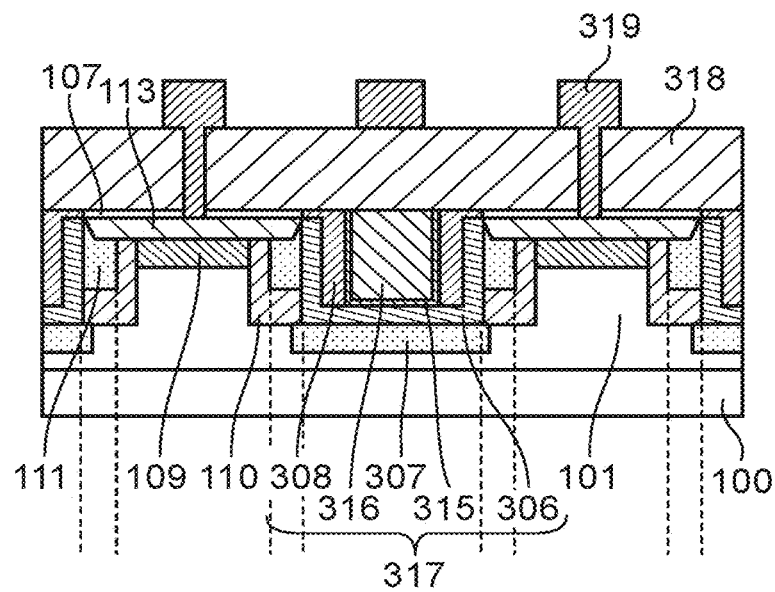
FIGS. 20A, 20B are diagrams showing the manufacturing method of the photo detector including the photo detection element according to the second embodiment.
Figure 20B:
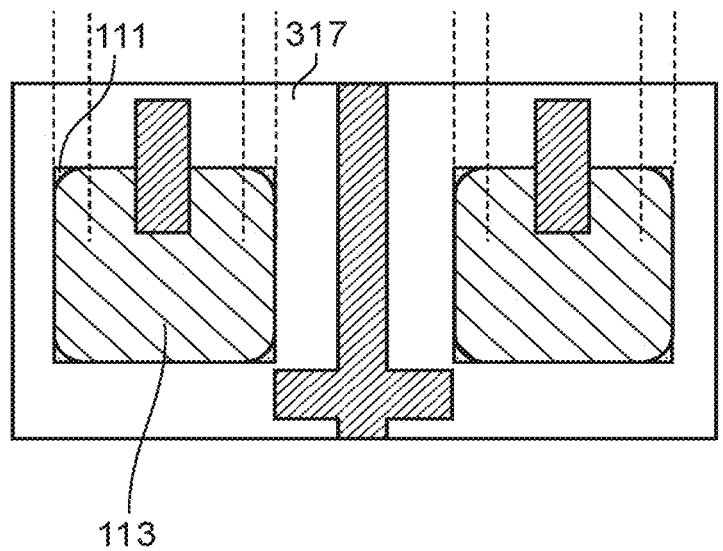

Next, as shown in FIGS. 20A, 20B, the insulating film layer 114 is formed at a thickness of 0.8 μm by a CVD method, and a contact hole is formed on an n-type avalanche layer 314 by a lithography process and an RIE process. After that, an aluminum electrode 319 is formed at a thickness of 0.8 μm by a sputtering method, for example, and is processed into a prescribed shape by a lithography method and an RIE method. At this time, the aluminum electrode 116 is also embedded into the contact hole to form an ohmic contact with the n-type avalanche layer 113.

Next, the insulating layer 320 is formed at a thickness of 0.8 μm by a CVD method, and a via hole is formed on the aluminum electrode 116 by a lithography process and an RIE process. After that, the quench resistor 112 is formed by a sputtering method, and is processed into a prescribed shape by a lithography method and an RIE method. A material of the quench resistor is preferably SiCr and its nitride film, Ti and its nitride film, or a laminated structure thereof, and though being different and depending on the specification of the device, a film thickness is approximately in a range of not less than 5 nm and not more than 50 nm. After that, a silicon nitride film as the passivation film 322 is formed at a thickness of 0.3 μm by a CVD method, and a reading pad is opened by an RIE method. Finally, a Ti/Au film is formed as the mutual back surface electrode 119 on the back surface of the single crystal p-type silicon substrate 100 in the same manner as the first embodiment, to manufacture the photo detector shown in FIGS. 14A, 14B. In addition, the groove formed on the passivation film 117 is a groove formed in manufacturing, and may be embedded with an insulating material.

The photo detector according to the second embodiment further separates a path of the carriers from the vicinity of the damage at the time of forming the element isolation structure, and thereby, in addition to the same effect as the first embodiment, can suppress after pulse noise resulting from a defect more than the first embodiment.

Third Embodiment

Figure 21:
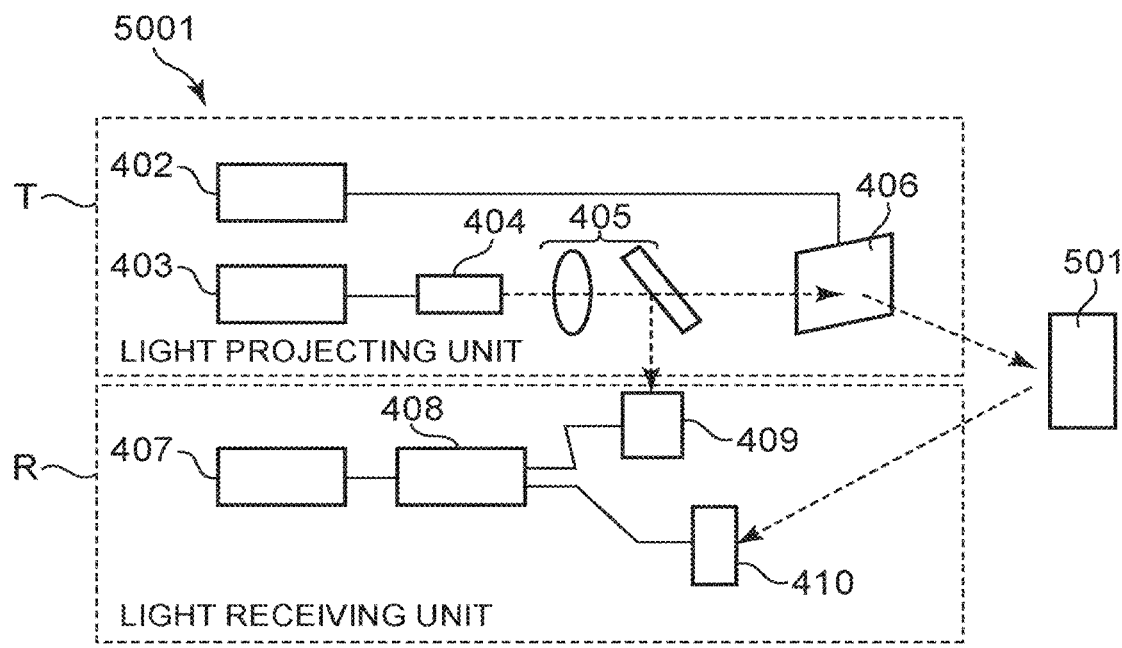
FIG. 21 is a diagram showing a lidar device according to a third embodiment.

FIG. 21 shows a lidar (Laser Imaging Detection and Ranging: LIDAR) device 5001 according to the present embodiment.

This embodiment is composed of a line light source and a lens, and can be applied to a long distance photographing subject detection system (LIDAR), and so on. The lidar device 5001 is provided with a light projecting unit T to project laser light to an object 501 and a light receiving unit R (also called a photo detection system) which receives the laser light from the object 501, measures a time required for the laser light to reciprocate to the object 501, and converts the time into a distance.

In the light projecting unit T, a laser light oscillator (also called a light source) 404 oscillates laser light. A drive circuit 403 drives the laser light oscillator 404. An optical system 405 extracts a part of the laser light as reference light, and irradiates the object 501 with the other laser light via a mirror 406. A mirror controller 402 controls the mirror 406 to project the laser light to the object 501. Here, light projecting means to project light.

In the light receiving unit R, a reference light detector 409 detects the reference light extracted by the optical system 405. A photo detector 108 receives a reflected light from the object 501. A distance measuring circuit 408 measures a distance to the object 501, based on the reference light detected by the reference light photo detector 409 and the reflected light detected by the photo detector 108. An image recognition system 407 recognizes the object 501, based on the result measured by the distance measuring circuit 408.

The lidar device 5001 is employs a light flight time ranging method (Time of Flight) which measures a time required for a laser light to reciprocate to the object 501 and converts the time into a distance. The lidar device 5001 is applied to an on-vehicle drive-assist system, remote sensing, and so on. When any of the photo detectors of the above-described embodiments is used as the photo detector 108, the lidar device 5001 expresses good sensitivity particularly in a near infra-red region. For this reason, it becomes possible to apply the lidar device 5001 to a light source in a human-invisible wavelength band. The lidar device 5001 can be used for obstacle detection for vehicle, for example.

In addition, it is preferable that a plurality of sets of the photo detector 108 and the light source 404 are provided, and the arrangement relation thereof is previously set by software (can be replaced by a circuit). It is preferable that regarding the arrangement relation of the sets of the photo detector 108 and the light source 404, the sets are provided at an equal interval. By this means, the output signals of the respective photo detectors 108 are complemented with each other, and thereby an accurate three-dimensional image can be generated by the image recognition system.

Figure 22:
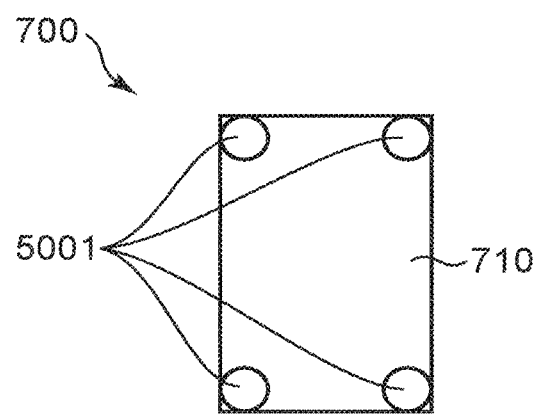
FIG. 22 is a diagram for describing a measurement system of the lidar device of FIG. 21.

FIG. 22 is a schematic top view of a vehicle provided with the lidar device according to the present embodiment.

A vehicle 700 according to the present embodiment is provided with the lidar devices 5001 at the four corners of a vehicle body 710.

The vehicle according to the present embodiment is provided with the lidar devices at the four corners of the vehicle body, and accordingly it can detect environment in the whole directions of the vehicle by the lidar devices.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photo detection element comprising:
   a first region of a first conductivity type;
   a second region of a second conductivity type;
   a third region of the first conductivity type provided between the first region and the second region;
   a fourth region of the second conductivity type provided so as to surround a periphery of the second region, in a direction crossing with a direction from the first region toward the second region; and
   a fifth region of the first conductivity type provided between the first region and the fourth region.

2. The photo detection element according to claim 1, wherein:
   at least a part of the fifth region is provided between the third region and the fourth region.

3. The photo detection element according to claim 2, wherein:
   the photo detection element is a pn junction diode in which the second region and the third region are pn joined.

4. The photo detection element according to claim 3, further comprising:
   an electrode for applying a reverse bias not less than a breakdown voltage to the photo detection element to make the photo detection element perform a Geiger operation; and
   a quench resistor which is electrically connected to the electrode and is provided so as to converge carriers by voltage drop.

5. The photo detection element according to claim 4, further comprising:
   an element isolation structure provided among a plurality of the photo detection elements.

6. The photo detection element according to claim 5, wherein:
   the fourth region covers at least a part of the element isolation structure.

7. The photo detection element according to claim 6, wherein:
   the fourth region has a depth indicating a concentration peak which is at the same level as or deeper than the element isolation structure.

8. The photo detection element according to claim 7, wherein:
   a depth indicating an impurity concentration peak of the fifth region is deeper than a depth indicating a concentration peak of the third region.

9. The photo detection element according to claim 8, wherein:
   an impurity peak concentration of the fifth region is higher than an impurity peak concentration of the third region.

10. The photo detection element according to claim 9, wherein:
    an impurity peak concentration of the fourth region is lower than an impurity peak concentration of the second region.

11. The photo detection element according to claim 10, wherein:
    the fourth region covers at least a part of an edge of the second region.

12. The photo detection element according to claim 11, wherein:
    at least one of the second region, the third region, the fourth region, and the fifth region has a curvature at each of four corners seen from a light incident direction.

13. A photo detection system comprising:
    a photo detection element; and
    a distance measuring circuit to calculate a light flight time from an output signal of the photo detection element;
    the photo detection element including
    a first region of a first conductivity type,
    a second region of a second conductivity type,
    a third region of the first conductivity type provided between the first region and the second region,
    a fourth region of the second conductivity type provided so as to surround a periphery of the second region, in a direction crossing with a direction from the first region toward the second region, and
    a fifth region of the first conductivity type provided between the first region and the fourth region.

14. A lidar device comprising:
    a light source to irradiate an object with light; and
    a photo detection system to detect the light reflected from the object;
    the photo detection system including
    a photo detection element to detect the light reflected from the object, and
    a distance measuring circuit to calculate a light flight time from an output signal of the photo detection element;
    the photo detection element including
    a first region of a first conductivity type,
    a second region of a second conductivity type,
    a third region of the first conductivity type provided between the first region and the second region,
    a fourth region of the second conductivity type provided so as to surround a periphery of the second region, in a direction crossing with a direction from the first region toward the second region, and
    a fifth region of the first conductivity type provided between the first region and the fourth region.

15. The lidar device according to claim 14 further comprising:
an image recognition system to generate a three-dimensional image based on arrangement relation of the light source and the photo detection element.

16. A vehicle comprising:
four lidar devices at respective four corners of a vehicle body;
the lidar device including
a light source to irradiate an object with light, and
a photo detection system to detect the light reflected from the object;
the photo detection system including
a photo detection element to detect the light reflected from the object, and
a distance measuring circuit to calculate a light flight time from an output signal of the photo detection element;
the photo detection element including
a first region of a first conductivity type,
a second region of a second conductivity type,
a third region of the first conductivity type provided between the first region and the second region,
a fourth region of the second conductivity type provided so as to surround a periphery of the second region, in a direction crossing with a direction from the first region toward the second region, and
a fifth region of the first conductivity type provided between the first region and the fourth region.

* * * * *